(12) United States Patent
Shammugasamy et al.

(10) Patent No.: US 10,601,383 B2
(45) Date of Patent: Mar. 24, 2020

(54) AMPLIFIER CIRCUIT AND TRANSIMPEDANCE AMPLIFIER CIRCUIT

(71) Applicant: PixArt Imaging Inc., Hsin-Chu (TW)

(72) Inventors: Balasubramaniam Shammugasamy, Penang (MY); Kei Tee Tiew, Penang (MY)

(73) Assignee: PixArt Imaging Inc., Hsin-Chu (TW)

( * ) Notice: Subject to any disclaimer, the term of this patent is extended or adjusted under 35 U.S.C. 154(b) by 0 days.

(21) Appl. No.: 16/104,954

(22) Filed: Aug. 20, 2018

(65) Prior Publication Data
US 2020/0059213 A1    Feb. 20, 2020

(51) Int. Cl.
*H03F 1/02*    (2006.01)
*H03F 3/08*    (2006.01)
*H03F 3/45*    (2006.01)
*H03F 3/21*    (2006.01)

(52) U.S. Cl.
CPC ........... *H03F 3/45475* (2013.01); *H03F 3/21* (2013.01); *H03F 2200/129* (2013.01); *H03F 2200/153* (2013.01); *H03F 2203/45116* (2013.01); *H03F 2203/45512* (2013.01); *H03F 2203/45526* (2013.01); *H03F 2203/45548* (2013.01)

(58) Field of Classification Search
CPC ........ H03F 1/02; H03F 3/08; H03F 2200/151; H03F 2200/291

USPC .............................. 327/307, 308; 330/9, 308
See application file for complete search history.

(56) References Cited

U.S. PATENT DOCUMENTS

| 6,469,562 B1* | 10/2002 | Shih | H03F 1/301 |
| | | | 327/307 |
| 9,787,923 B2* | 10/2017 | Petilli | H04N 5/3696 |
| 2008/0007344 A1* | 1/2008 | Natzke | H03F 3/08 |
| | | | 330/308 |
| 2018/0266852 A1* | 9/2018 | Cusey | G01D 5/347 |

* cited by examiner

*Primary Examiner* — Steven J Mottola
(74) *Attorney, Agent, or Firm* — Winston Hsu

(57) ABSTRACT

An amplifier circuit comprising: a first amplifier, comprising a voltage input terminal and a voltage output terminal; a voltage offset providing circuit, comprising a first terminal coupled to a first predetermined voltage source, a second terminal coupled to the voltage output terminal, and a third terminal, wherein a voltage at the third terminal is higher than a voltage at the second terminal by an offset voltage; and a voltage control capacitor, comprising a fourth terminal coupled to the third terminal, and a fifth terminal coupled to the voltage input terminal, wherein a capacitance value of the voltage control capacitor corresponds to a voltage difference between a voltage at the fifth terminal and a voltage at the fourth terminal. A better compensation for the amplifier circuit can be acquired since a voltage control capacitor having a capacitance value corresponding to the output voltage of the amplifier is applied.

15 Claims, 3 Drawing Sheets

AMPLIFIER CIRCUIT AND TRANSIMPEDANCE AMPLIFIER CIRCUIT

BACKGROUND OF THE INVENTION

1. Field of the Invention

The present invention relates to an amplifier circuit and a transimpedance amplifier circuit, and particularly relates to an amplifier circuit and a transimpedance amplifier circuit which have a voltage control capacitor.

2. Description of the Prior Art

Conventionally, an amplifier circuit comprising at least one amplifier is applied to amplify a signal. A capacitor is always applied to an amplifier for compensation. As illustrated in FIG. 1, a capacitor 101 is provided between an input terminal and an output terminal of an amplifier 100. Such capacitor is called a Miller capacitor which is for "Miller compensation" if the amplifier 100 is a second stage amplifier. The Miller capacitor can be configured to split two poles, hence the loop stability of the amplifier circuit can be enhanced.

However, the capacitance of the capacitor 101 is fixed and could not change responding to the output voltage of the amplifier 100, thus could not meet some requirements of the amplifier circuit.

SUMMARY OF THE INVENTION

Therefore, one objective of the present invention is to provide an amplifier circuit with a voltage control capacitor for compensation, which has a capacitance value corresponding to an output voltage of an amplifier.

Another objective of the present invention is to provide a transimpedance amplifier circuit with a voltage control capacitor for compensation, which has a capacitance value corresponding to an output voltage of an amplifier.

One embodiment of the present invention discloses an amplifier circuit comprising: a first amplifier, comprising a voltage input terminal and a voltage output terminal; a voltage offset providing circuit, comprising a first terminal coupled to a first predetermined voltage source, a second terminal coupled to the voltage output terminal, and a third terminal, wherein a voltage at the third terminal is higher than a voltage at the second terminal by an offset voltage; and a voltage control capacitor, comprising a fourth terminal coupled to the third terminal, and a fifth terminal coupled to the voltage input terminal, wherein a capacitance value of the voltage control capacitor corresponds to a voltage difference between a voltage at the fifth terminal and a voltage at the fourth terminal.

Another embodiment of the present invention disclose a transimpedance amplifier circuit configured to convert an input current to an output voltage, comprising: an amplifier, comprising a current input terminal for receiving the input current and a voltage output terminal for outputting the output voltage; a voltage offset providing circuit, comprising a first terminal coupled to a first predetermined voltage source, a second terminal coupled to the voltage output terminal, and a third terminal, wherein a voltage at the third terminal is higher than a voltage at the second terminal by an offset voltage; and a voltage control capacitor, comprising a fourth terminal coupled to the third terminal, and a fifth terminal coupled to the current input terminal, wherein a capacitance value of the voltage control capacitor corresponds to a voltage difference between a voltage at the fifth terminal and a voltage at the fourth terminal.

Based upon above-mentioned embodiments, the amplifier applies a voltage control capacitor having a capacitance value corresponding to the output voltage of the amplifier, such that a better compensation for the amplifier circuit can be acquired. Besides, the voltage control capacitor can be implemented by a MOS capacitor, such that the area occupied by the amplifier circuit can be decreased.

These and other objectives of the present invention will no doubt become obvious to those of ordinary skill in the art after reading the following detailed description of the preferred embodiment that is illustrated in the various figures and drawings.

DETAILED DESCRIPTION

In following descriptions, several embodiments are provided to explain the concept of the present application. It will be appreciated that the term "couple" means a direct electrical connection or an indirect electrical connection between two components or terminals. For example, if A is coupled to B, it means A is electrically connected to B directly or indirectly. Besides, the term "couple" means an electrical path which does not substantially change the signal is formed between two components or terminals, unless the signal is processed by another component.

Figure 1:
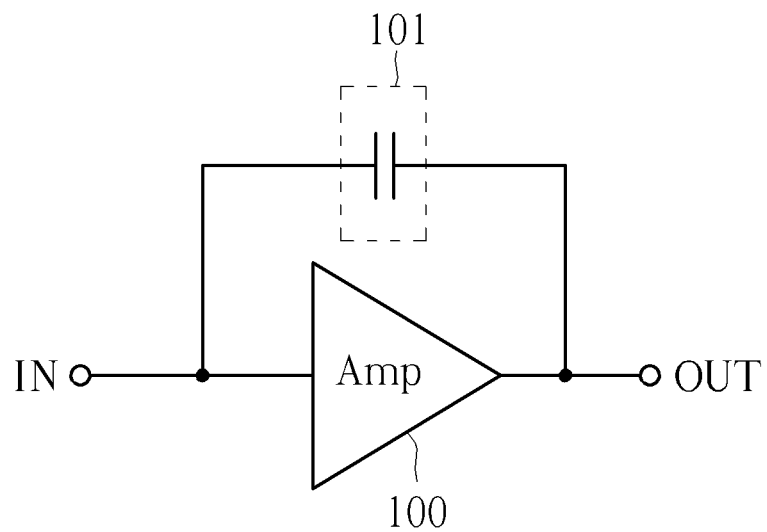
FIG. 1 is a schematic diagram illustrating a conventional Miller capacitor.
Figure 2:
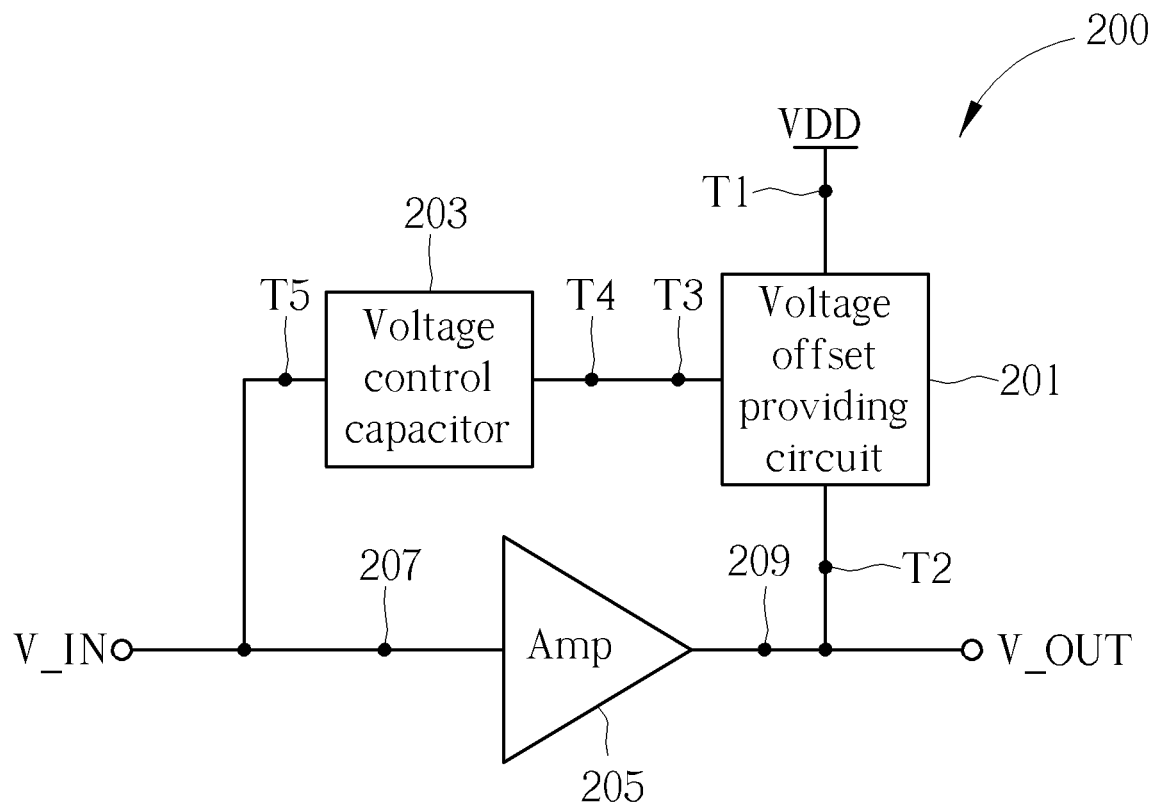
FIG. 2 is a block diagram illustrating an amplifier circuit according to one embodiment of the present invention.

FIG. 2 is a block diagram illustrating an amplifier circuit according to one embodiment of the present invention. As illustrated in FIG. 2, the amplifier circuit 200 comprises: a voltage offset providing circuit 201, a voltage control capacitor 203, and an amplifier 205. The amplifier 205 comprises a voltage input terminal 207 configured to receive an input voltage V_IN and a voltage output terminal 209 configured to output an output voltage V_OUT. The voltage offset providing circuit 201 comprises a first terminal T1 coupled to a first predetermined voltage source VDD, a second terminal T2 coupled to the voltage output terminal 209, and a third terminal T3. The voltage offset providing circuit 201 provides a voltage offset to a voltage at the third terminal T3 and a voltage at the second terminal T2, such that the voltage at the third terminal T3 is higher than the voltage at the second terminal T2 by an offset voltage. The voltage control capacitor 203 comprises a fourth terminal T4 coupled to the third terminal T3, and a fifth terminal T5 coupled to the voltage input terminal 207. In one embodiment, the third terminal T3 and the fourth terminal T4 are the same terminals. A capacitance value of the voltage control capacitor 203 corresponds to a voltage difference between a voltage at the fifth terminal T5 and a voltage at the fourth terminal T4.

Briefly, the voltage at the second terminal T2 is the same as the output voltage V_OUT, the voltage at the third terminal T3 and the fourth terminal T4 is higher than the voltage at the second terminal T2 by an offset voltage, and the voltage at the second terminal T5 is the same as the input voltage V_IN. Accordingly, the circuit structure illustrated in FIG. 2 can make sure the voltage at the third terminal T3 and the fourth terminal T4 is higher than the voltage at the second terminal T2, even if the input voltage V_IN and the output voltage V_OUT of the amplifier 205 are the same or similar. If the amplifier 205 is a second stage amplifier, the voltage control capacitor 203 can operate as a Miller capacitor for providing Miller compensation.

The voltage offset providing circuit 201 and the voltage control capacitor 203 can be implemented by various kinds of circuit structure circuit structures. In following descriptions, several examples are provided to explain the present application. It will be appreciated that the following examples do not mean to limit the scope of the present invention, any other circuit structures can perform the functions stated in FIG. 2 should fall in the scope of the present invention.

Figure 3:
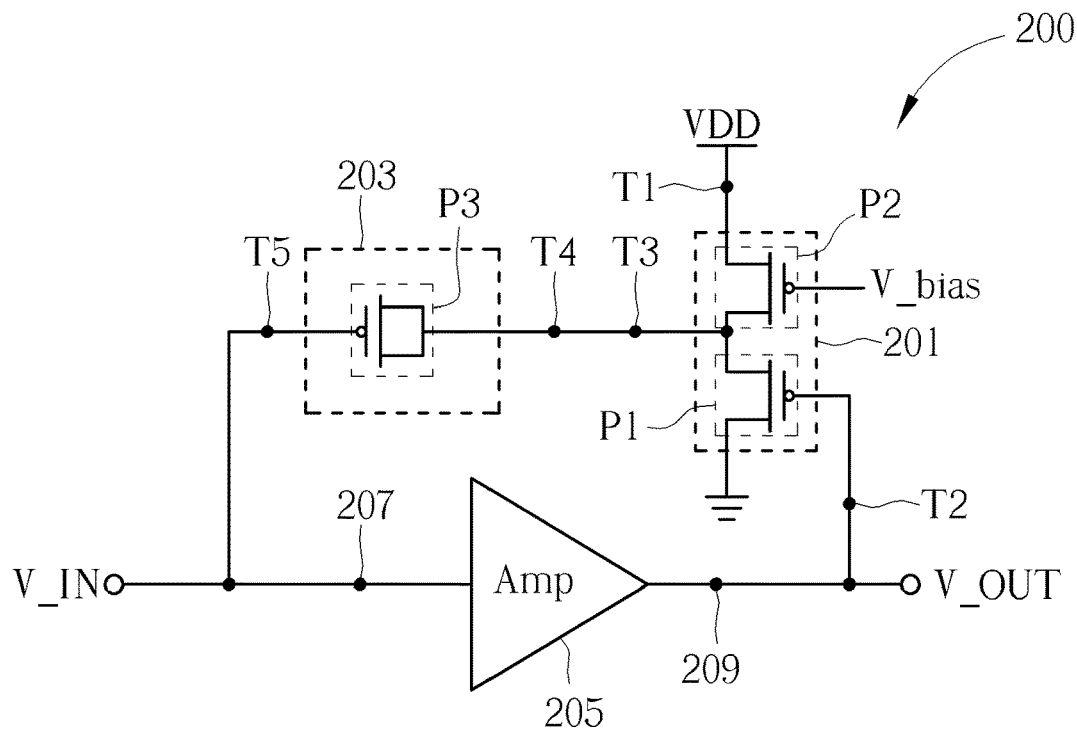
FIG. 3 is a circuit diagram illustrating a detail circuit structure for the amplifier circuit illustrated in FIG. 2 according to one embodiment of the present invention.

FIG. 3 is a circuit diagram illustrating a detail circuit structure for the amplifier circuit according to one embodiment of the present invention. In the embodiment of FIG. 3, the voltage offset providing circuit 201 is a source follower circuit comprising a P MOSFET (metal oxide semiconductor field effect transistor, herein after is named as MOS) P1 and a PMOS P2. The drain terminal of the PMOS M1 is coupled to a second predetermined voltage level (e.g. a ground voltage level). Also, the source terminal of the PMOS P1 is served as the third terminal T3. Besides, the gate terminal of the PMOS P1 is coupled to the output terminal 209. The source terminal of the PMOS P2 is served as the first terminal T1, the drain terminal of the PMOS P2 is served as the third terminal T3, and the gate terminal of the PMOS P2 receives a bias voltage V_bias. The bias voltage V_bias can come from any circuit, for example, a current mirror.

In the embodiment of FIG. 3, the above-mentioned offset voltage is a threshold voltage of the PMOS P1. Therefore, the PMOS P1 can be considered as a voltage offset providing transistor providing a voltage offset to the voltage at the second terminal T2 and the voltage at the third terminal T3. Such voltage offset providing transistor comprises a first terminal served as the second terminal T2 (gate terminal), a second terminal served as the third terminal T3 (source terminal), and a third terminal coupled to the second predetermined voltage level (drain terminal). Besides, the PMOS P2 is served as a current source configured to provide a current to the PMOS M1. The current generated by the PMOS P2 can be controlled by the bias voltage V_bias.

Additionally, in the embodiment of FIG. 3, the voltage control capacitor 203 is a PMOS P3, which is served as a MOS capacitor. The drain terminal and a source terminal of the PMOS P3 are short and are served as the fourth terminal T4, and the gate terminal of the PMOS P3 is served as the fifth terminal T5. Please note, the voltage control capacitor 203 can be implemented by an NMOS as well. The application of the MOS capacitor can save more area than a traditional capacitor such as a MIM (Metal Insulator Metal) capacitor or a PIP (Poly Insulator Poly) capacitor, since the MOS operating in an inversion region in a CMOS process has higher capacitance per unit area.

The source follower circuit (PMOS P1 and PMOS P2) can create the voltage difference between the two terminals of the PMOS P3, that is, the fourth terminal T4 and the fifth terminal T5. Such circuit structure can eventually adjust the capacitance value of the PMOS P3 to a desired value. As above-mentioned, the voltage at the source terminal of the PMOS P1 is higher than the gate voltage of itself by a threshold voltage of the PMOS P1. This will ensure the voltage at the fourth terminal T4 is higher than the voltage at the fifth terminal T5, even in the case where the output voltage swing of the amplifier 205 goes lower than the voltage at the fifth terminal T5. The above-mentioned source follower circuit can provide a wide output swing if the voltage difference between the voltage at the fifth terminal T5 and the voltage at the fourth terminal T4 is met for the PMOS P3 to act as a Miller capacitor.

Besides, as the Miller compensation provided by the Miller capacitor creates a zero on the right half plane, to cancel the zero, a nulling resistor is always included in a conventional amplifier circuit. In the present invention, the above-mentioned source follower circuit can create the same effect of a nulling resistor to cancel the zero. At the third terminal T3, the effective resistance is 1/gm1 (of the PMOS P1)||Rout (of the PMOS P2). Thus, in one embodiment, the PMOS P1 can be sized accordingly to have a sufficient amount of effective resistance so as to stabilize the feedback loop.

Figure 4:
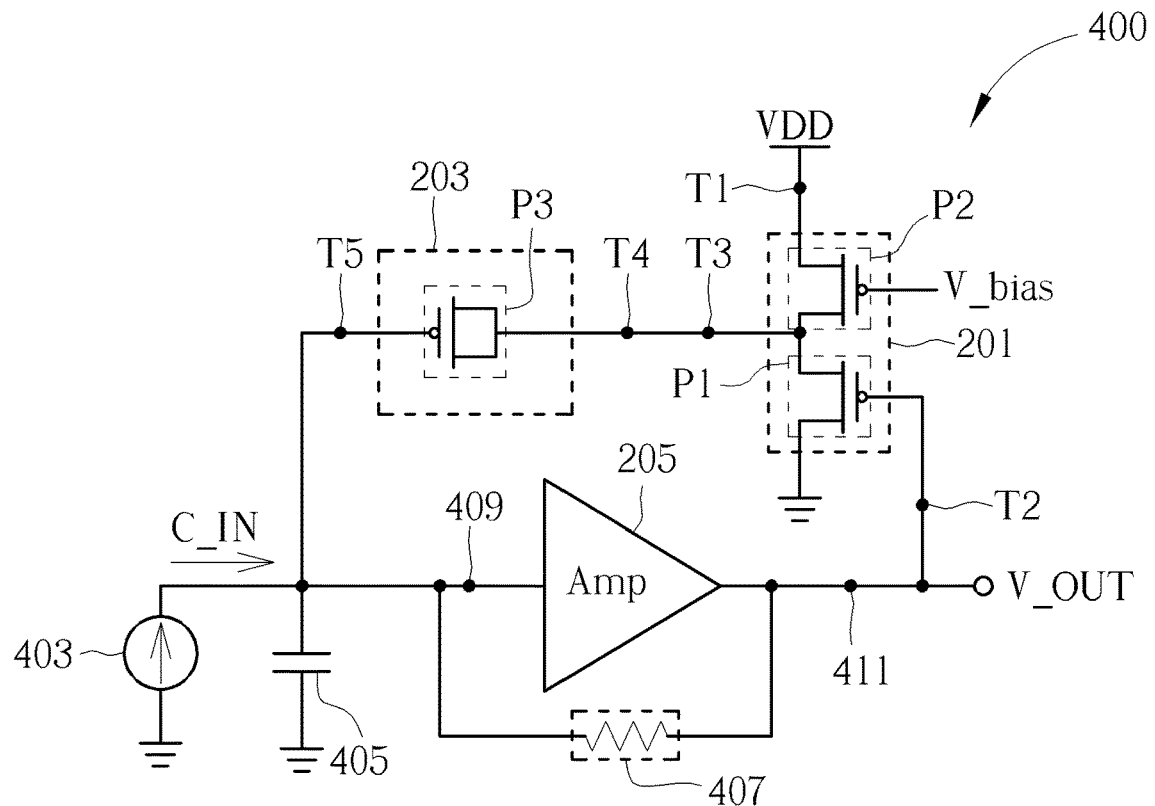
FIG. 4 is a circuit diagram illustrating a transimpedance amplifier circuit according to one embodiment of the present invention.

The circuit structures illustrated in FIG. 2, FIG. 3 can be applied to any kind of circuit. In the embodiment of FIG. 4, the circuit structures illustrated in FIG. 2, FIG. 3 are applied to a transimpedance amplifier circuit, which is applied to transfer an input current C_IN to an output voltage V_OUT. As illustrated in FIG. 4, the transimpedance amplifier circuit 400 comprises an amplifier 401, a current source 403, a capacitor 405, a resistor 407, a current input terminal 409 and a voltage output terminal 411.

The current input terminal 409 is configured to receive an input current C_IN, and the voltage output terminal 411 is configured to output an output voltage V_OUT. The capacitor 405 comprises a first terminal coupled to the current input terminal 409 and a second terminal coupled to the second predetermined voltage level (e.g. a ground voltage level). The resistor 407, which is served as a feedback resistor, is coupled between the current input terminal 409 and the voltage output terminal 411. The current source 403, for example, can be a photodiode. Also, in one embodiment, the amplifier 401 is a class-AB amplifier.

The voltage providing circuit 201, voltage control capacitor 203 illustrated in FIG. 2 are coupled to the current input terminal 409 and the voltage output terminal 411. For more detail, the fifth terminal T5 of the voltage control capacitor 203 is coupled to the current input terminal 409 and the second terminal T2 of the voltage providing circuit 201 is coupled to the voltage output terminal 411.

As above-mentioned, the amplifier 401 can be a class AB amplifier. As know by persons skilled in the art, junction photodiode capacitance (Cpd) forms the dominant pole in the system, as there are other additional multiple poles contributed by the class AB amplifier. Therefore, the transimpedance amplifier circuit needs to be compensated to ensure the stability condition is met. Since the output voltage swing of the transimpedance amplifier circuit is decided by the resistor 407, the amplitude of the output voltage V_OUT has a high relation with the input current C_IN. If the output voltage V_OUT is lower than the input voltage of the amplifier 401, the capacitance value of the voltage control capacitor 203 is small and this could trigger stability issue, if the amplifier circuit 400 does not have the voltage offset providing circuit 201 to control the voltage control capacitor 203. Therefore, as above-mentioned, the voltage offset providing circuit 201 can create a larger voltage difference between the two terminals of the voltage control capacitor 203. This will ensure the feedback loop of the transimpedance amplifier circuit 400 is stable with sufficient amount of capacitance of the voltage control capacitor 203. For example, if the output voltage V_OUT increases, the capacitance of the voltage control capacitor 203 correspondingly increases as well.

The voltage providing circuit 201, voltage control capacitor 203 can have the circuit structures illustrated in FIG. 3, as illustrated in FIG. 4. However, it does not mean to limit the scope of the present invention.

Figure 5:
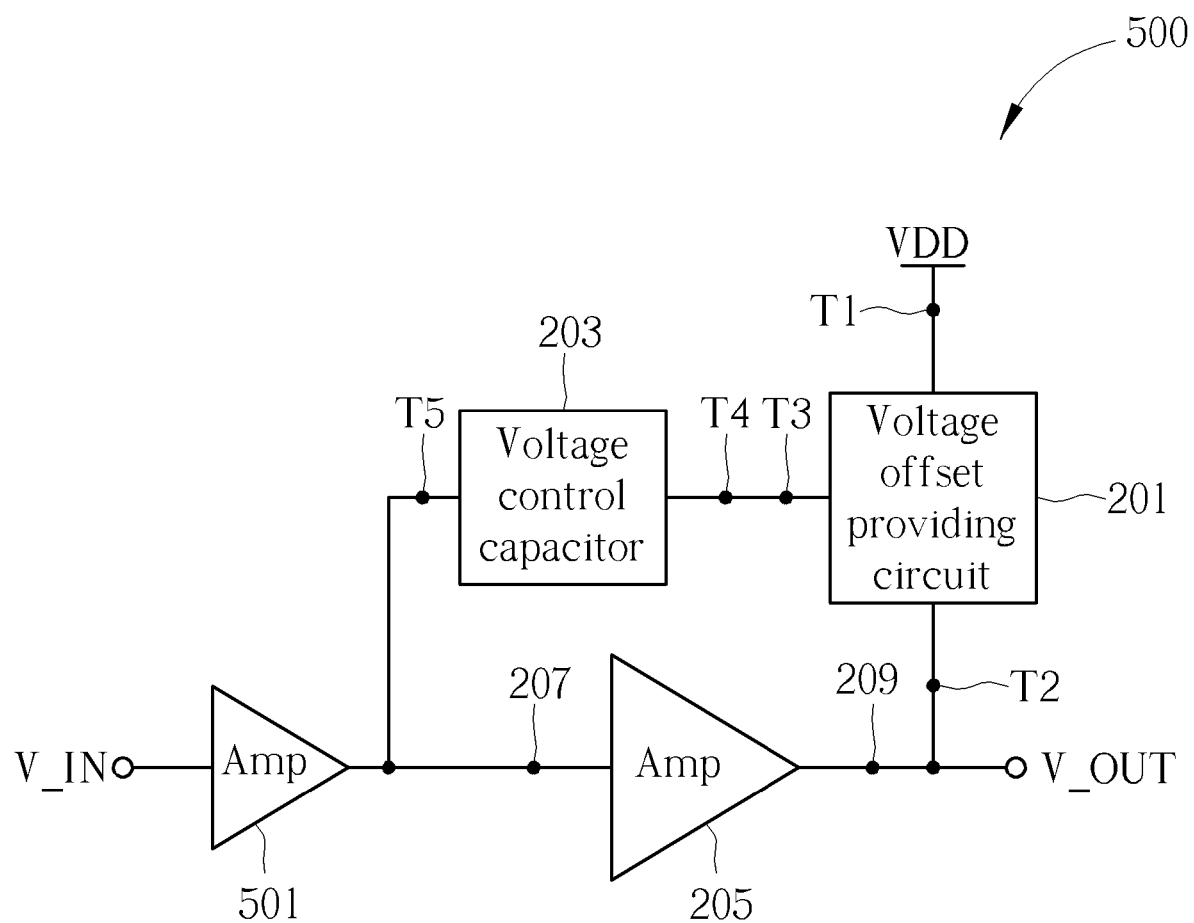
FIG. 5 is a block diagram illustrating an amplifier circuit according to another embodiment of the present invention.

In above-mentioned embodiments, the amplifier circuit only comprises a single amplifier. However, the amplifier circuit can comprise more than one amplifier. FIG. 5 is a block diagram illustrating an amplifier circuit according to another embodiment of the present invention. As illustrated in FIG. 5, compared with the amplifier circuit 200 in FIG. 2, the amplifier circuit 500 further comprises another amplifier 501, thus the amplifier 205 is a second stage amplifier of the amplifier circuit. In such circuit structure, the voltage control capacitor can operate as a Miller capacitor.

Based upon above-mentioned embodiments, the amplifier applies a voltage control capacitor having a capacitance value corresponding to the output voltage of the amplifier, such that a better compensation for the amplifier circuit can be acquired. Besides, the voltage control capacitor can be implemented by a MOS capacitor, such that the area occupied by the amplifier circuit can be decreased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit, comprising:
a first amplifier, comprising a voltage input terminal and a voltage output terminal;
a voltage offset providing circuit, comprising a first terminal coupled to a first predetermined voltage source, a second terminal coupled to the voltage output terminal, and a third terminal, wherein a voltage at the third terminal is higher than a voltage at the second terminal by an offset voltage; and
a voltage control capacitor, comprising a fourth terminal coupled to the third terminal, and a fifth terminal coupled to the voltage input terminal, wherein a capacitance value of the voltage control capacitor corresponds to a voltage difference between a voltage at the fifth terminal and a voltage at the fourth terminal.

2. The amplifier circuit of claim 1, wherein the voltage offset providing circuit is a source follower circuit.

3. The amplifier circuit of claim 2, wherein the voltage offset providing circuit comprises:
a voltage offset providing transistor, comprising a first terminal served as the second terminal of the voltage offset providing circuit, a second terminal served as the third terminal of the voltage offset providing circuit, and a third terminal coupled to a second predetermined voltage level; and
a current source, coupled between the voltage offset providing transistor and the first predetermined voltage level, configured to provide a current to the voltage offset providing transistor.

4. The amplifier circuit of claim 3,
wherein the voltage offset providing transistor is a first PMOS comprising a gate terminal served as the second terminal of the voltage offset providing circuit, a source terminal served as the third terminal of the voltage offset providing circuit, and a drain terminal served as the third terminal of the voltage offset providing transistor;
wherein the offset voltage is a threshold voltage of the first PMOS;
wherein the current source is a second PMOS comprising a gate terminal configured to receive a bias signal, a source terminal served as the first terminal of the voltage offset providing circuit, and a drain terminal served as the third terminal of the voltage offset providing circuit.

5. The amplifier circuit of claim 1, wherein the voltage control capacitor is a MOS capacitor, wherein a drain terminal and a source terminal of the voltage control capacitor are short and are served as the fourth terminal, and the gate terminal of the voltage control capacitor is served as the fifth terminal.

6. The amplifier circuit of claim 1, further comprising:
a second amplifier, comprising a voltage output terminal coupled to the voltage input terminal of the first amplifier.

7. A transimpedance amplifier circuit configured to convert an input current to an output voltage, comprising:
an amplifier, comprising a current input terminal for receiving the input current and a voltage output terminal for outputting the output voltage;
a voltage offset providing circuit, comprising a first terminal coupled to a first predetermined voltage source, a second terminal coupled to the voltage output terminal, and a third terminal, wherein a voltage at the third terminal is higher than a voltage at the second terminal by an offset voltage; and
a voltage control capacitor, comprising a fourth terminal coupled to the third terminal, and a fifth terminal coupled to the current input terminal, wherein a capacitance value of the voltage control capacitor corresponds to a voltage difference between a voltage at the fifth terminal and a voltage at the fourth terminal.

8. The transimpedance amplifier circuit of claim 7, wherein the voltage offset providing circuit is a source follower circuit.

9. The transimpedance amplifier circuit of claim 8, wherein the voltage offset providing circuit comprises:
a voltage offset providing transistor, comprising a first terminal served as the second terminal of the voltage offset providing circuit, a second terminal served as the third terminal of the voltage offset providing circuit, and a third terminal coupled to a second predetermined voltage level; and
a current source, coupled between the voltage offset providing transistor and the first predetermined voltage level, configured to provide a current to the voltage offset providing transistor.

10. The transimpedance amplifier circuit of claim 9,
wherein the voltage offset providing transistor is a first PMOS comprising a gate terminal served as the second terminal of the voltage offset providing circuit, a source terminal served as the third terminal of the voltage offset providing circuit, and a drain terminal served as the third terminal of the voltage offset providing transistor;
wherein the offset voltage is a threshold voltage of the first PMOS;
wherein the current source is a second PMOS comprising a gate terminal configured to receive a bias signal, a source terminal served as the first terminal of the voltage offset providing circuit, and a drain terminal served as the third terminal of the voltage offset providing circuit.

11. The transimpedance amplifier circuit of claim 7, wherein the voltage control capacitor is a MOS capacitor, wherein a drain terminal and a source terminal of the voltage control capacitor are short and are served as the fourth terminal, and the gate terminal of the voltage control capacitor is served as the fifth terminal.

12. The transimpedance amplifier circuit of claim 7, further comprising:
a resistor, coupled between the current input terminal and the voltage output terminal.

13. The transimpedance amplifier circuit of claim 7, further comprising:
a capacitor, coupled between the current input terminal and a second predetermined voltage level.

14. The transimpedance amplifier circuit of claim 7, wherein the input current is from a photo diode.

15. The transimpedance amplifier circuit of claim 7, wherein the amplifier is a class AB amplifier.

* * * * *